(12) United States Patent
Zhou et al.

(10) Patent No.: US 7,656,198 B1
(45) Date of Patent: Feb. 2, 2010

(54) METHOD AND APPARATUS FOR PROVIDING A COMBINATION DIFFERENTIAL DRIVER

(75) Inventors: Shidong Zhou, Milpitas, CA (US); Yi-hui Hsieh, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/999,091

(22) Filed: Dec. 3, 2007

(51) Int. Cl.
*H03K 19/094* (2006.01)

(52) U.S. Cl. ........................ 326/115; 326/121; 326/127; 327/108; 327/87

(58) Field of Classification Search ................. 326/115, 326/121, 127
See application file for complete search history.

(56) References Cited

U.S. PATENT DOCUMENTS

| | | | |
|---|---|---|---|
| 7,253,663 B2* | 8/2007 | Cho et al. | 326/115 |
| 7,336,780 B2* | 2/2008 | Lim et al. | 379/388.06 |
| 2004/0047428 A1* | 3/2004 | Teng et al. | 375/295 |
| 2004/0136519 A1* | 7/2004 | Lim et al. | 379/388.06 |
| 2005/0156621 A1* | 7/2005 | Dubey | 326/12 |
| 2007/0115030 A1* | 5/2007 | Bhattacharya et al. | 326/83 |
| 2007/0139086 A1* | 6/2007 | Liu | 327/108 |
| 2007/0263747 A1* | 11/2007 | Matsumoto et al. | 375/296 |
| 2007/0263749 A1* | 11/2007 | Teng et al. | 375/312 |

\* cited by examiner

*Primary Examiner*—Vibol Tan
(74) *Attorney, Agent, or Firm*—Kin-Wah Tong

(57) ABSTRACT

In one embodiment, an integrated device is disclosed. For example, in one embodiment of the present invention, a device comprises a logic control, and a combination differential driver coupled to the logic control, wherein the logic control receives a control signal for configuring the combination differential driver as a Low Voltage Differential Signaling (LVDS) driver or as a Transition Minimized Differential Signaling (TMDS) driver.

19 Claims, 5 Drawing Sheets

METHOD AND APPARATUS FOR PROVIDING A COMBINATION DIFFERENTIAL DRIVER

FIELD OF THE INVENTION

One or more aspects of the present invention relate generally to data communication and, in particular, to a combination differential driver that can be selectively configured to operate as a Low Voltage Differential Signaling (LVDS) driver or a Transition Minimized Differential Signaling (TMDS) driver.

BACKGROUND OF THE INVENTION

Low Voltage Differential Signaling (LVDS) is a signaling technology that can operate at very high speeds over inexpensive, twisted-pair copper cables. LVDS transmits two different voltages which are compared at the receiver. LVDS uses this difference in voltage between the two wires to encode the information. More specifically, the LVDS output driver includes differential output terminals coupled to a current source that drives a differential pair of signal transmission lines. The basic input driver or receiver has a high DC input impedance, so that the majority of the driver current flows across a termination resistor. When the output driver switches, it changes the direction of current flow across the resistor, thereby creating a valid "one" (or high) or "zero" (or low) logic state.

Transition Minimized Differential Signaling (TMDS) is a signaling technology that is similar to LVDS in that it also uses differential signaling to reduce electromagnetic interference which allows faster signal transfers with increased accuracy. TMDS can be used to transmit high-speed serial data and is used by the Digital Visual Interface (DVI) specification and High Definition Multimedia Interface (HDMI) specification.

However, although LVDS drivers and TMDS drivers share some common features, they are structurally different and they operate under different operating parameters and have different operating characteristics. As such, depending on the operating environment, one type of differential signaling driver may be selected over the other type of differential signaling driver. Thus, a manufacturer may provide a communication device or circuit having both types of differential signaling driver. However, providing both types of differential signaling driver on a single communication device or circuit will significantly increase (e.g., double) the differential Input/Output (I/O) area, thereby consuming space on a die.

SUMMARY OF THE INVENTION

In one embodiment, an integrated device is disclosed. For example, in one embodiment of the present invention, a device comprises a logic control, and a combination differential driver coupled to the logic control, wherein the logic control receives a control signal for configuring the combination differential driver as a Low Voltage Differential Signaling (LVDS) driver or as a Transition Minimized Differential Signaling (TMDS) driver.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
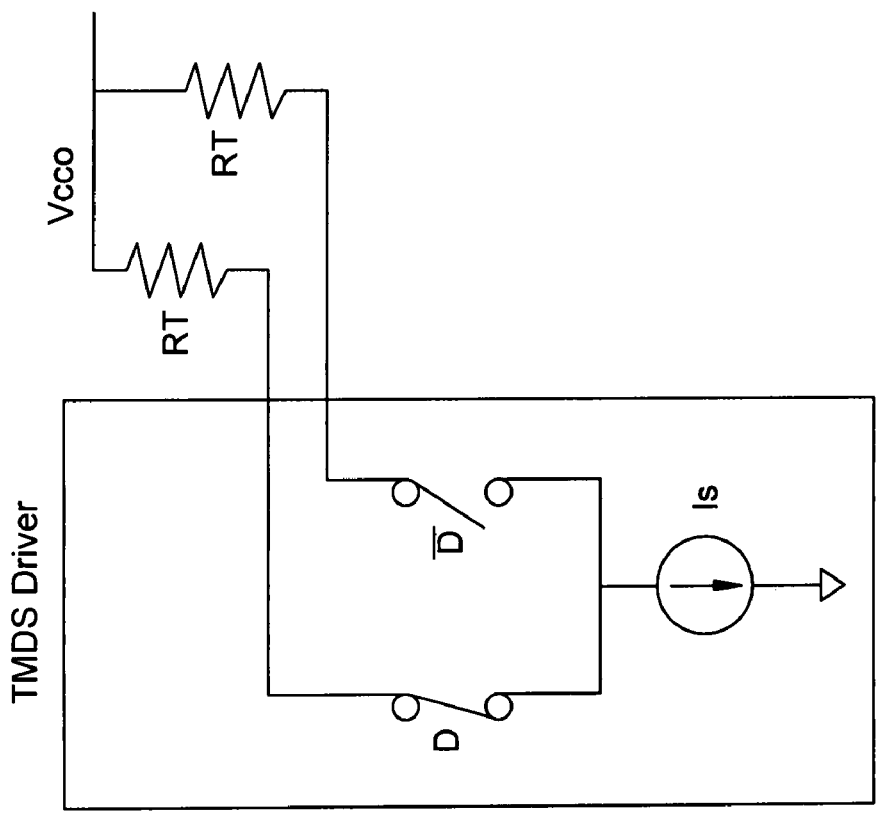
FIG. 1 illustrates an illustrative TMDS driver.

FIG. 1 illustrates an illustrative TMDS driver as is known in the prior art. The TMDS driver is an open-drain typed device. For example, D represents the data input, $V_{cco}$ represents the I/O power supply, and $I_s$ represents a current source. When D equals to "1", one side (e.g., a positive side) of the TMDS driver will reach the $V_{cco}$ value with the pull-up resistor RT, whereas the other side (e.g., a negative side) of the TMDS driver will draw current on the RT and provides a $(V_{cco}-I_s*RT)$ value. It should be noted that the resistors RTs are external to the driver. The vice versa effect will occur when D=0.

Figure 2:
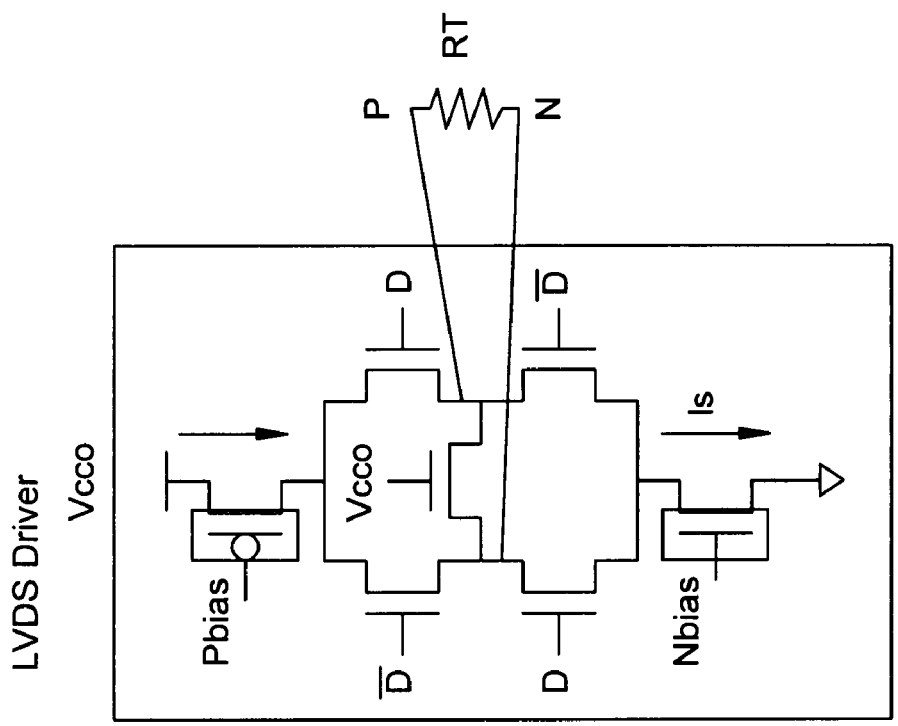
FIG. 2 illustrates an illustrative LVDS driver.

FIG. 2 illustrates an illustrative LVDS driver as is known in the prior art. For example, D represents the data input and $V_{cco}$ represents the I/O power supply. When D=1, the PMOS transistor on the positive side and NMOS transistor on the negative side of the differential driver will turn on to create a current path through the resistor RT. It should be noted that the resistor RT is external to the driver. The differential output becomes $(I_s*RT)$. The vice versa effect will occur when D=0. Thus, depending on the signals on the D and $\overline{D}$ data inputs, current will flow across the resistor RT either from the direction P toward N or from the direction N toward P. However, in the LVDS driver, to achieve the current load specifications, it employs dual bias transistors ($P_{bias}$ transistor and $N_{bias}$ transistor) which will lock the current flow through the differential pair and limit the output swing range.

As illustrated in FIG. 1 and FIG. 2, the TMDS driver and LVDS driver have different structures. For example, the TMDS driver does not have dual bias transistors, e.g., a PMOS transistor and a NMOS transistor ($P_{bias}$ and $N_{bias}$). Thus, implementing both types of driver as separate drivers on a device or circuit will significantly increase the differential I/O area as well as the overall cost of the device.

Figure 3:
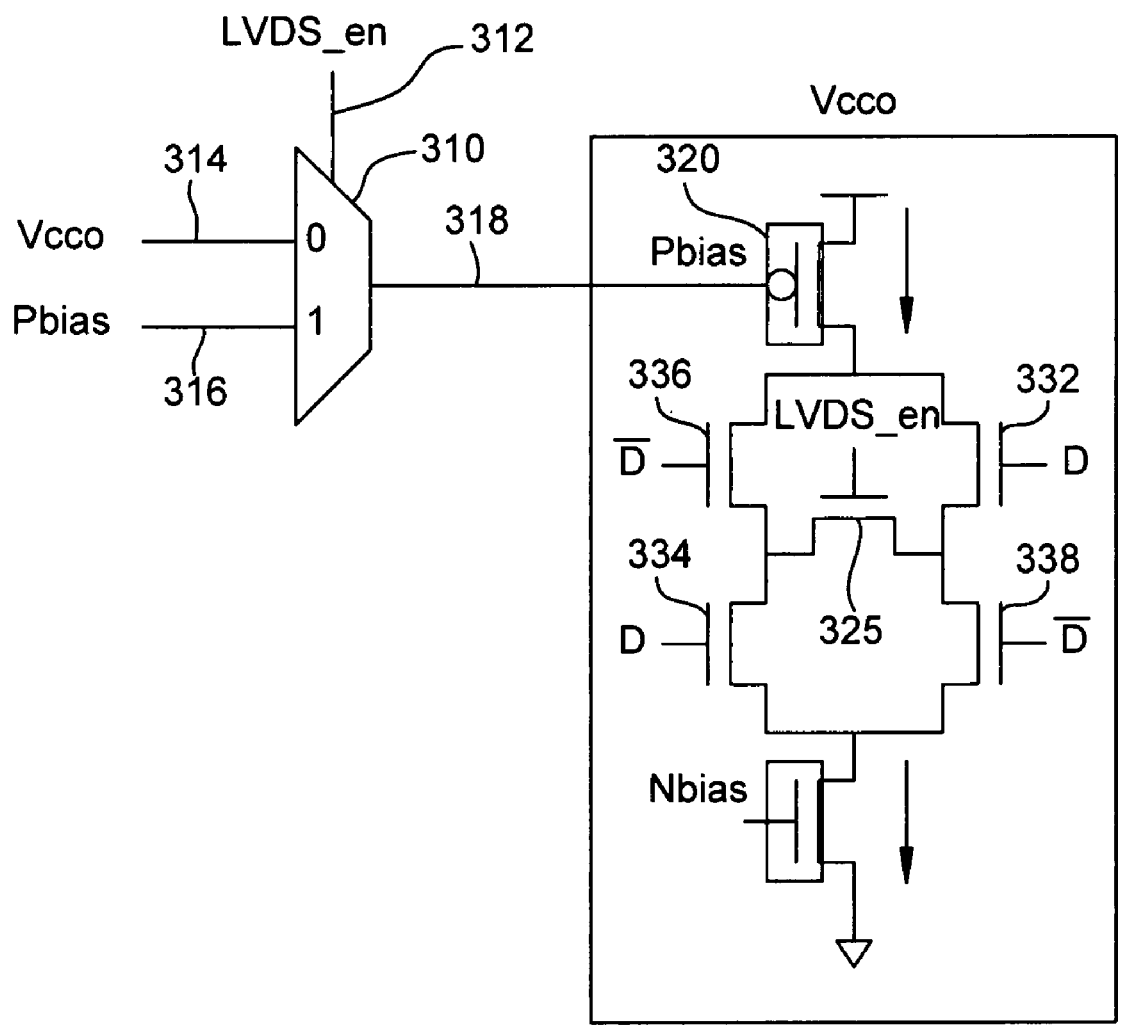
FIG. 3 illustrates an illustrative combination differential driver of the present invention.

FIG. 3 illustrates an illustrative combination differential driver 300 of the present invention. In one embodiment, an additional logic control 310 (e.g., a multiplexer 310) is employed to configure the combination differential driver 300. The multiplexer 310 is controlled by a control signal LVDS_en signal 312 (broadly a select signal), which is used to control or configure the combination differential driver 300 as either a TMDS driver or a LVDS driver.

In one embodiment, the combination differential driver 300 comprises four transistors 332, 334, 336, 338 (e.g., NMOS transistors) for receiving data inputs D and/or $\overline{D}$. The combination differential driver 300 also comprises two bias transistors 320, 330 (e.g., each of these bias transistors can be broadly perceived as a biasing module or circuit) and a passgate 325 (e.g., a passgate transistor). The operation of the combination differential driver 300 will be described below.

In operation, the output 318 of the multiplexer 310 is coupled to a PMOS transistor 320 (e.g., a bias PMOS transistor), and the inputs of the multiplexer 310 are coupled to $V_{cco}$ 314 and $P_{bias}$ 316. When LVDS_en=0, both the passgate (e.g., transistor 325) through the differential pair and the bias PMOS transistor 320 are in the off state such that the driver 300 behaves like an open-drain sink. In other words, driver 300 can be selectively configured to operate as a TMDS driver.

Alternatively, when LVDS_en=1, the $P_{bias}$ signal is applied to the gate of the transistor 320, which allows the combination differential driver 300 to behave like a LVDS driver. It should be noted that in one embodiment, the signal representing LVDS_en=1 can be selected to be equivalent to $V_{cco}$. Thus, combination differential driver 300 can be selectively configured to operate as a LVDS driver.

Figure 4:
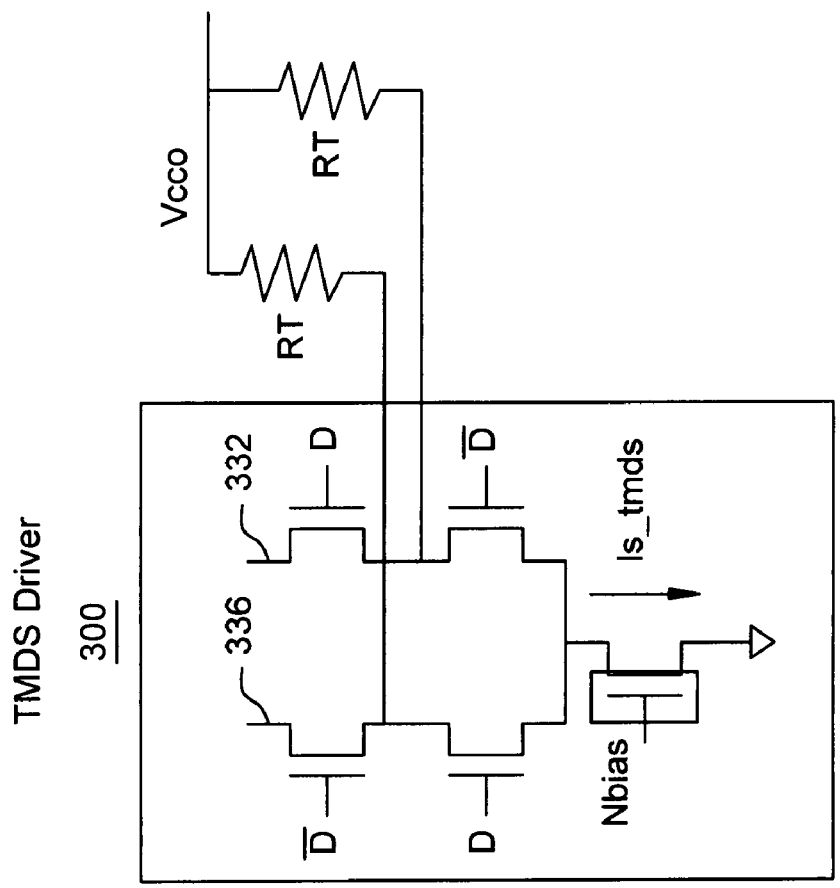
FIG. 4 illustrates an illustrative combination differential driver of the present invention configured as a TMDS driver.

FIG. 4 illustrates the combination differential driver 300 of the present invention configured as a TMDS driver. For example, when LVDS_en is "0" (or low), the transistor 320 and transistor 325 (as shown in FIG. 3) are turned off, thereby resulting in a driver configuration as shown in FIG. 4. More specifically, transistors 336 and 332 will not be used in this configuration. In this configuration, combination differential driver 300 can operate as a TMDS driver.

Figure 5:
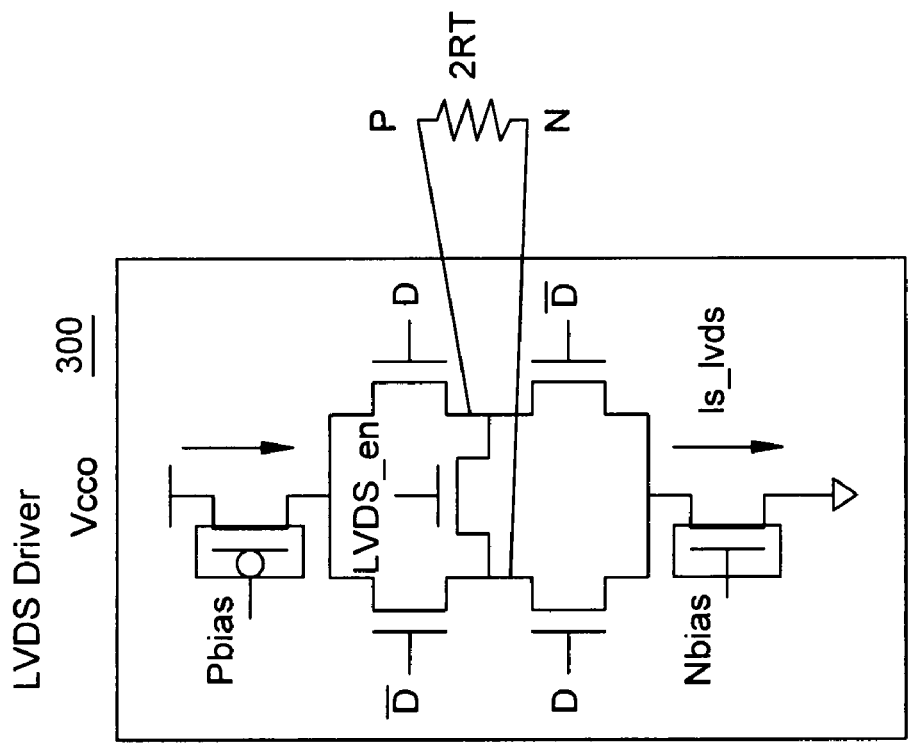
FIG. 5 illustrates an illustrative combination differential driver of the present invention configured as a LVDS driver.

FIG. 5 illustrates the combination differential driver 300 of the present invention configured as a LVDS driver. For example, when LVDS_en is "1" (or high), the transistor 320 receives $P_{bias}$ at its gate and transistor 325 (as shown in FIG. 3) is turned on, thereby resulting in a driver configuration as shown in FIG. 5. More specifically, transistor 320 receives the $P_{bias}$ signal at its gate and the LVDS_en signal is received at the gate of the pass gate 325. In one embodiment, the LVDS_en signal can be equivalent to $V_{cco}$. In this configuration, combination differential driver 300 can operate as a LVDS driver.

In one embodiment of the present invention, a configurable bias circuit is employed with the combination differential driver 300 of the present invention. For example, the bias circuit is a feedback controlled bias circuit.

Figure 6:
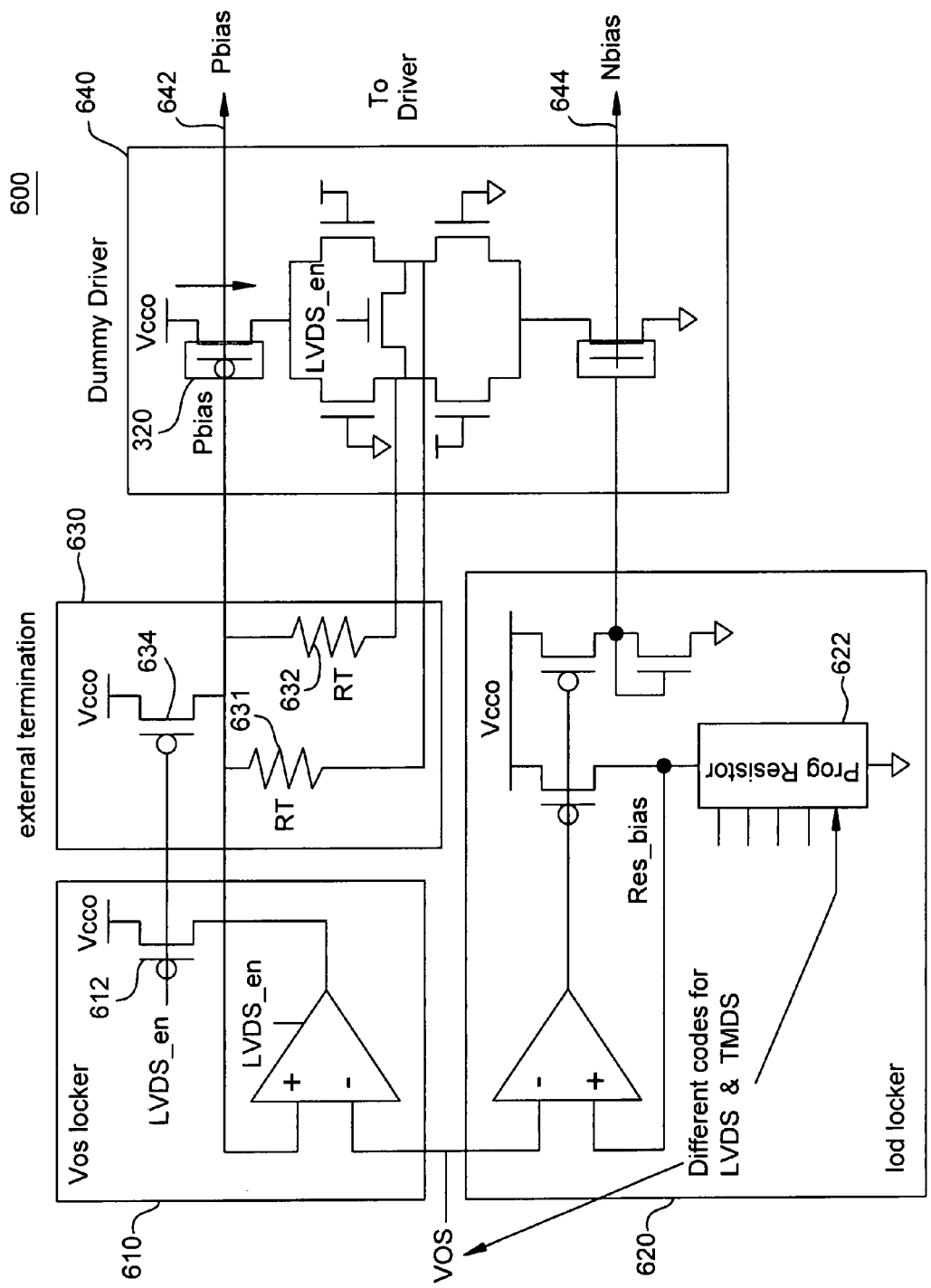
FIG. 6 illustrates a high level block diagram of bias circuit of the present invention.

FIG. 6 illustrates a high level block diagram of bias circuit 600 of the present invention. In one embodiment, the bias circuit 600 comprises four modules or portions: a $V_{os}$ locker module 610, an $I_{od}$ locker 620, an external termination module 630, and a dummy driver 640.

The external termination module 630 provides the necessary termination (e.g., pull-up resistor(s)) as required in LVDS driver and TMDS driver implementations. For example, the termination is split into a pair of 50 ohm resistors RT 631, 632 and a transistor 634 serving as a switch. The switch is disposed between the $V_{cco}$ and the resistors RT, where the switch serves as a control for configuring the external termination module 630 to form different termination type. Thus, the external termination module 630 is capable of providing a configurable resistance termination to the combination differential driver 300 of the present invention. For example, the transistor 634 has the LVDS_en signal applied to its gate. When LVDS_en signal is "0", the switch is turned on and the external termination module 630 forms or mimics a termination appropriate for a TMDS driver. When LVDS_en signal is "1", the switch is turned off and the external termination module 630 forms or mimics a termination appropriate for a LVDS driver. It should be noted that in the LVDS driver configuration, the external termination module 630 is used in conjunction with the Vos locker module 610 for generating the $P_{bias}$ signal.

The dummy driver 640 is employed to provide feedback via feedback loop to ensure proper bias signals are generated. In one embodiment, the dummy driver 640 is implemented in a similar configuration as the combination differential driver 300. For example, a $P_{bias}$ signal 642 and a $N_{bias}$ signal 644 are first provided to the dummy driver 640 before being provided to the combination differential driver 300.

It should be noted in differential signaling implementations, operation is specified in terms of two parameters, e.g., $V_{od}$ and $V_{os}$. $V_{od}$ is the voltage difference or swing between the two output terminals of the output driver 300. $V_{os}$ is the average level of the two output voltage signals. In operation, the $V_{os}$ locker module 610 is employed to lock the $V_{od}$ and the $I_{od}$ locker 620 is used to lock the $I_{od}$. Using the $V_{os}$ locker module 610 and the $I_{od}$ locker 620, a $P_{bias}$ signal 642 and a $N_{bias}$ signal 644 can be provided to the combination differential driver 300. However, as discussed in FIG. 3, the combination differential driver 300 may be selectively configured to operate as either a TMDS driver or a LVDS driver. Although the $P_{bias}$ signal and the $N_{bias}$ signal are needed in the operation of the LVDS driver, only the $N_{bias}$ signal is needed for the TMDS driver (e.g., see FIG. 4 and FIG. 5). As such, the bias circuit 600 of the present invention is also selectively configurable for biasing a TMDS driver or a LVDS driver.

To illustrate, if the combination differential driver 300 is configured to operate as a TMDS driver, then it is necessary to disable the generation of the $P_{bias}$ signal. For example, the $V_{os}$ locker employs a transistor 612 having a gate that receives the LVDS_en signal. When the LVDS_en signal equals to "0" (e.g., selecting the combination differential driver 300 to operate as a TMDS driver), then transistor 612 turns on and the $P_{bias}$ signal is disabled.

Alternatively, if the combination differential driver 300 is configured to operate as a LVDS driver, then it is necessary to enable the generation of the $P_{bias}$ signal. Specifically, when the LVDS_en signal equals to "1" (e.g., selecting the combination differential driver 300 to operate as a LVDS driver), then the transistor 612 is turned off and the $P_{bias}$ signal is enabled.

It should be noted that $V_{os}$ can be generated by a bandgap circuit and its level can be adjusted by a voltage divider. In turn, the $I_{od}$ locker module locks the bias current through $V_{os}$ by using a configurable or programmable resistor chain 622. It should be noted that since different $N_{bias}$ signals may be required depending on how the combination differential driver is configured, the programmable resistor chain 622 can be programmed using different codes (e.g., one code for LVDS configuration and another code for TMDS configuration). Thus, appropriate Nbias signals can be generated based on the resistance that is selected in the $I_{od}$ locker module 620.

Figure 7:
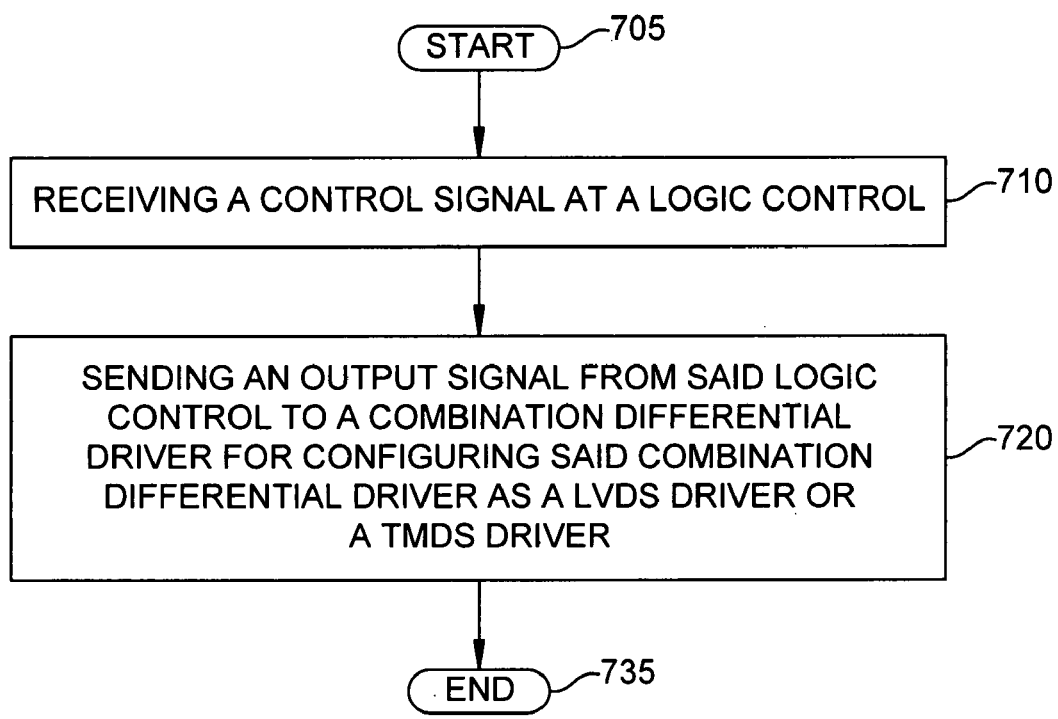
FIG. 7 illustrates a flow chart of a method for configuring a combination differential driver as LVDS driver or a TMDS driver.

FIG. 7 illustrates a flow chart of a method 700 for configuring a combination differential driver as a LVDS driver or a TMDS driver. Method 700 starts in step 705 and proceeds to step 710.

In step 710, a control signal is received at a control logic, e.g., a LVDS_en signal is received at multiplexer 310. The control signal is used to select one of the input signals as an output signal of the multiplexer.

In step 720, the output signal is sent to the combination differential driver for configuring the combination differential driver as a LVDS driver or a TMDS driver. For example, the $V_{cco}$ signal can be sent to the combination differential driver for configuring the combination differential driver as a TMDS driver. Alternatively, the $P_{bias}$ signal can be sent to the combination differential driver for configuring the combination differential driver as a LVDS driver. Method 700 then ends in step 735.

It should be noted that although not specifically specified, one or more steps of method 700 may include a storing, displaying and/or outputting step as required for a particular application. In other words, any data, records, fields, and/or intermediate results discussed in the method can be stored, displayed and/or outputted to another device as required for a particular application. Furthermore, steps or blocks in FIG. 7 that recite a determining operation or involve a decision, do not necessarily require that both branches of the determining operation be practiced. In other words, one of the branches of the determining operation can be deemed as an optional step.

It should be noted that the term "transistor" should be broadly interpreted as a switching means and "resistor" should be broadly interpreted as a resistive means. As such, although the present invention is disclosed above in terms of transistors and resistors, those skilled in the art will realize that these devices can be replaced with other devices performing similar functions.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A device, comprising:
   a logic control;
   a combination differential driver coupled to the logic control; and
   a configurable bias circuit coupled to the combination differential driver, wherein the configurable bias circuit provides one or more bias signals to the combination differential driver,
   wherein the combination differential driver comprises a first biasing module, and
   wherein the logic control receives a control signal and provides an output signal to the first biasing module for configuring the combination differential driver as a Low Voltage Differential Signaling (LVDS) driver or as a Transition Minimized Differential Signaling (TMDS) driver.

2. The device of claim 1, wherein the logic control comprises a multiplexer.

3. The device of claim 2, wherein the multiplexer receives an input/output (I/O) power supply signal as a first input signal and a bias signal as a second input signal, and wherein the control signal is a select signal for the multiplexer.

4. The device of claim 3, wherein selecting the input/output (I/O) power supply signal as the output signal of the multiplexer causes the combination differential driver to be configured as the TMDS driver.

5. The device of claim 3, wherein selecting the bias signal as the output signal of the multiplexer causes the combination differential driver to be configured as the LVDS driver.

6. The device of claim 5, wherein the bias signal is a $P_{bias}$ signal for controlling a bias transistor of the biasing module in the combination differential driver.

7. The device of claim 5, wherein the control signal is equivalent to the input/output (I/O) power supply signal, and wherein the control signal is for controlling a passgate in the combination differential driver.

8. The device of claim 1, wherein the configurable bias circuit is configured to provide two bias signals to the combination differential driver if the combination differential driver is configured as the LVDS driver.

9. The device of claim 1, wherein the configurable bias circuit is configured to provide one bias signal to the combination differential driver if the combination differential driver is configured as the TMDS driver.

10. The device of claim 1, wherein the one or more bias signals are generated in accordance with a programmable resistor.

11. The device of claim 1, wherein the configurable bias circuit is further configured to provide a configurable resistance termination to the combination differential driver.

12. The device of claim 11, wherein the configurable resistance termination is configured as a termination for the LVDS driver or as a termination for the TMDS driver.

13. The device of claim 1, wherein the combination differential driver further comprises:
   a first transistor coupled to the first biasing module;
   a second transistor coupled to the first biasing module;
   a third transistor coupled to the first transistor;
   a fourth transistor coupled to the second transistor;
   a passgate transistor coupled to the first transistor, the second transistor, the third transistor, and the fourth transistor; and
   a second biasing module, coupled to the third transistor and the fourth transistor.

14. The device of claim 1, wherein the configurable bias circuit further comprises:
   a dummy driver for receiving the one or more bias signals.

15. The device of claim 14, wherein the configurable bias circuit further comprises:
   a voltage locker module coupled to the dummy driver for generating one of the one or more bias signals.

16. The device of claim 14, wherein the configurable bias circuit further comprises:
   a current locker module coupled to the dummy driver for generating one of the one or more bias signals.

17. A device, comprising:
   a logic control;
   a combination differential driver coupled to the logic control;
   a configurable bias circuit coupled to the combination differential driver, wherein the configurable bias circuit provides one or more bias signals to the combination differential driver, wherein the configurable bias circuit comprises a dummy driver for receiving the one or more bias signals; and
   wherein the combination differential driver comprises a first biasing module, and
   wherein the logic control receives a control signal and provides an output signal to the first biasing module for configuring the combination differential driver as a Low Voltage Differential Signaling (LVDS) driver or as a Transition Minimized Differential Signaling (TMDS) driver.

18. The device of claim 17, wherein the configurable bias circuit further comprises:
   a voltage locker module coupled to the dummy driver for generating one of the one or more bias signals.

19. The device of claim 17, wherein the configurable bias circuit further comprises:
   a current locker module coupled to the dummy driver for generating one of the one or more bias signals.

* * * * *